United States Patent [19]

Hirao

[11] Patent Number: 4,772,567

[45] Date of Patent: Sep. 20, 1988

[54] METHOD OF PRODUCING A SEMICONDUCTOR INTEGRATED CIRCUIT BI-MOS DEVICE

[75] Inventor: Tadashi Hirao, Itami, Japan

[73] Assignee: Mitsubishi Denki Kabushiki Kaisha, Tokyo, Japan

[21] Appl. No.: 4,845

[22] Filed: Jan. 12, 1987

Related U.S. Application Data

[63] Continuation of Ser. No. 721,699, Apr. 10, 1985, abandoned.

[30] Foreign Application Priority Data

Apr. 12, 1984 [JP] Japan .................. 59-74340

[51] Int. Cl.$^4$ .............. H01L 21/283; H01L 21/20
[52] U.S. Cl. .............................. 437/33; 437/31; 437/41; 437/59; 357/43
[58] Field of Search ............ 437/31, 33, 34, 41, 437/59, 193, 200; 357/43

[56] References Cited

U.S. PATENT DOCUMENTS

| | | | |
|---|---|---|---|
| 3,865,649 | 2/1975 | Beasom | 148/187 |
| 4,050,965 | 9/1977 | Ipri et al. | 148/175 |
| 4,445,268 | 5/1984 | Hirao | 29/571 |
| 4,481,706 | 11/1984 | Roche | 29/577 C |
| 4,484,388 | 11/1984 | Iwasaki | 29/571 |
| 4,486,942 | 12/1984 | Hirao | 29/571 |
| 4,505,027 | 3/1985 | Schwabe et al. | 29/577 C |
| 4,512,075 | 4/1985 | Vora | 29/577 C |
| 4,529,456 | 7/1985 | Anzai et al. | 148/186 |
| 4,545,116 | 10/1985 | Lau | 29/591 |

FOREIGN PATENT DOCUMENTS 0097379 1/1984 European Pat. Off. .

OTHER PUBLICATIONS

Ghandhi, "VLSI Fabrication Principles", 1983, John Wiley & Sons, pp. 435-437.

Primary Examiner—Brian E. Hearn
Assistant Examiner—T. N. Quach
Attorney, Agent, or Firm—Birch, Stewart, Kolasch & Birch

[57] ABSTRACT

A method of producing a semiconductor integrated circuit device in which a bipolar element and a MOS element are produced on a same chip, which includes forming an oxide film on the epitaxial regions of the device; depositing a silicon film on the device over epitaxial regions and forming a base electrode leading region using said silicon; and forming a base leading layer by diffusion from said base electrode leading region to reduce the distance between a collector leading region and the base electrode leading region, thereby enhancing the characteristics of the bipolar element.

5 Claims, 4 Drawing Sheets

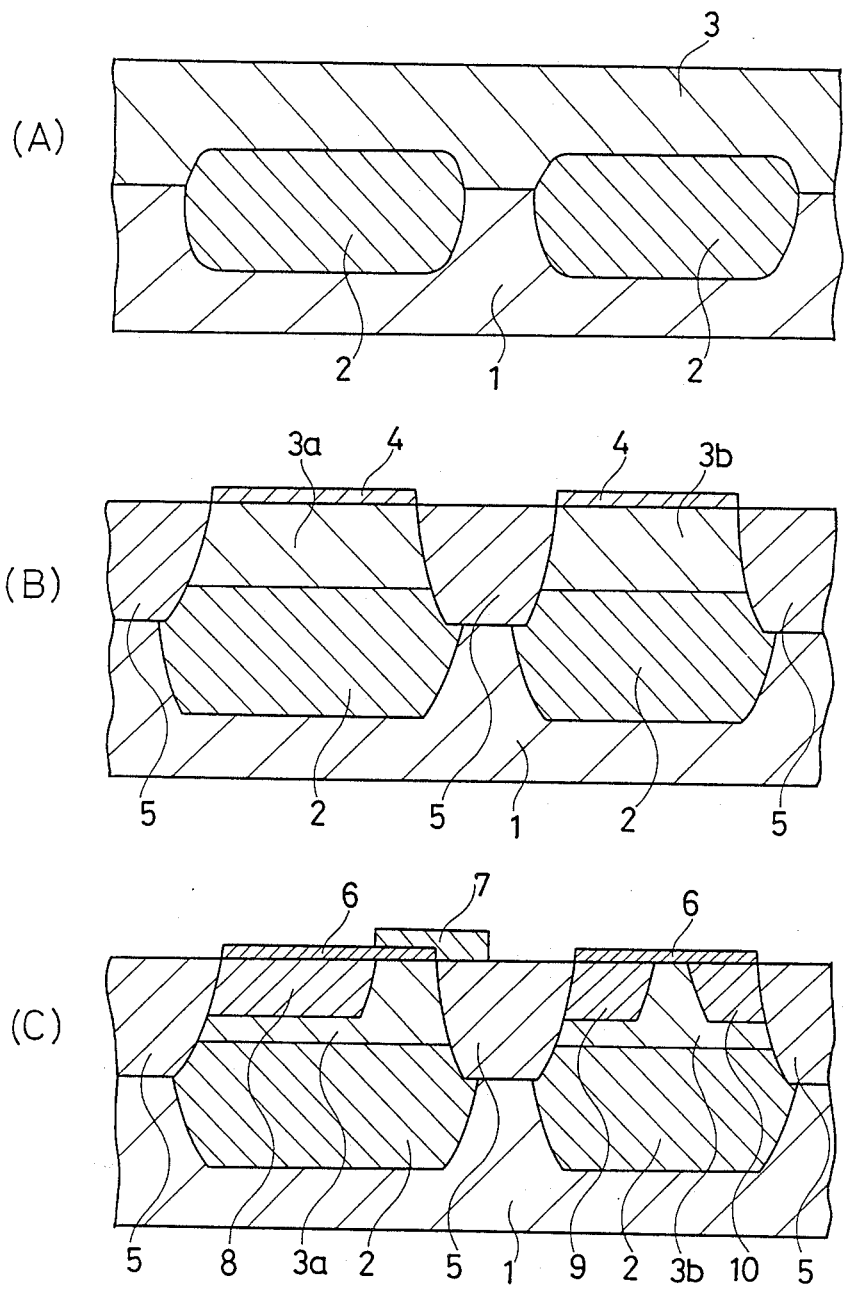

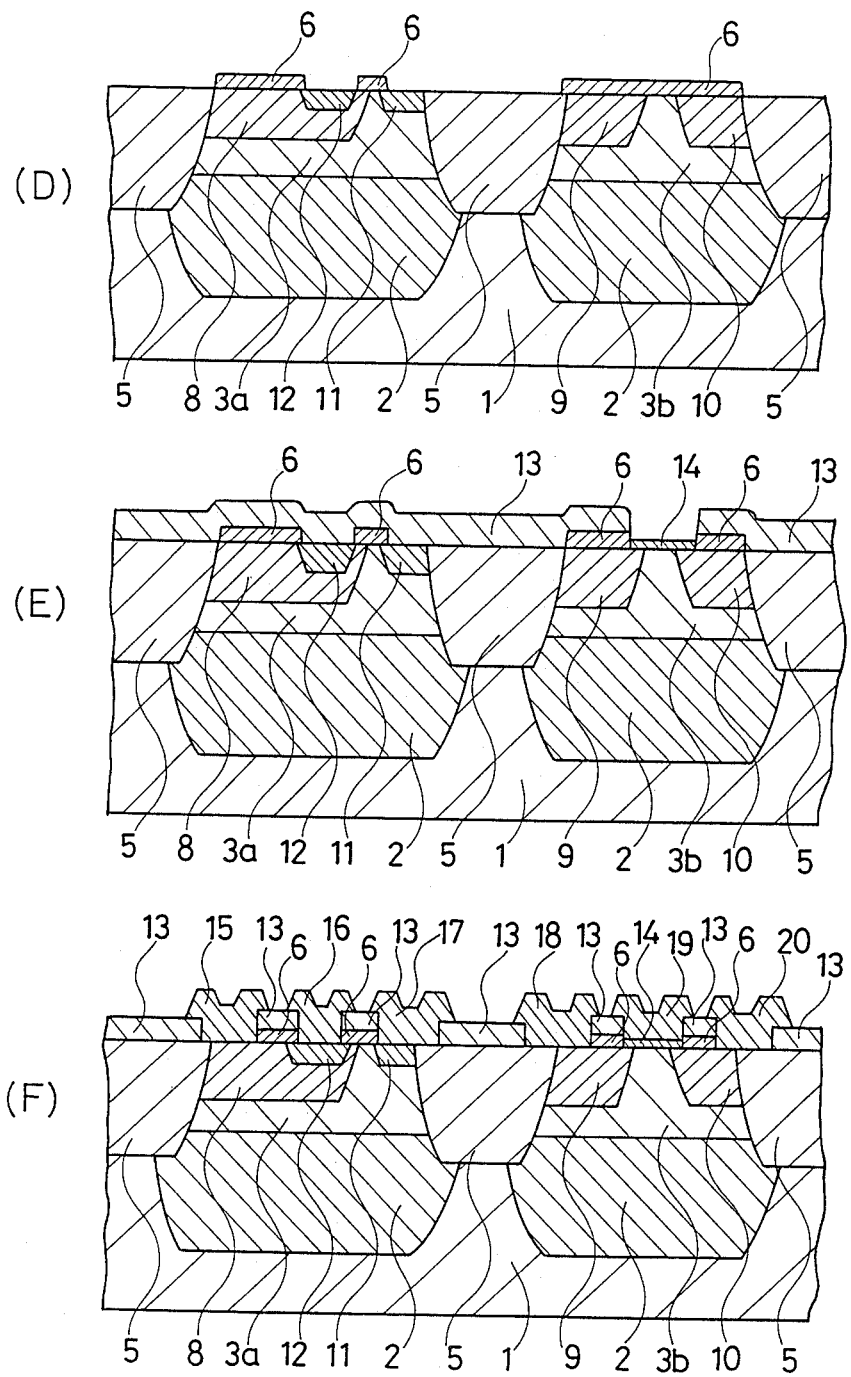

F I G .4.
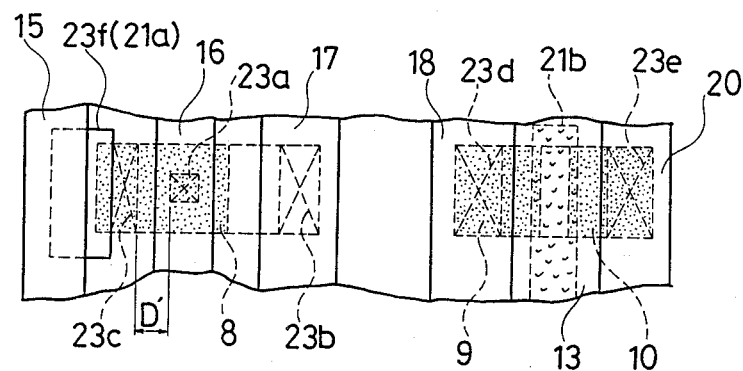

METHOD OF PRODUCING A SEMICONDUCTOR INTEGRATED CIRCUIT BI-MOS DEVICE

This application is a continuation of application Ser. No. 721,699, filed on Apr. 10, 1985, and now abandoned.

FIELD OF THE INVENTION

The present invention relates to a method of producing a semiconductor integrated circuit device, and more particularly, to that of producing a so-called BI-MOS semiconductor integrated circuit device in which MOS elements and bipolar elements are produced on the same chip.

BACKGROUND OF THE INVENTION

Generally, bipolar elements have a high driving ability for the amount of chip area occupied by the bipolar elements, and have a high accuracy in the processing of analog quantity. However, bipolar elements exhibit the disadvantages of a low integration density and a low input impedance. In contrast, MOS elements have a high input impedance and a high integration density, and accordingly it is effective to include MOS elements in a chip where bipolar elements are mainly used in order to supplement the disadvantages of the bipolar elements. As a typical example there are MOS top operational amplifiers where MOS elements are used at the input stage. These amplifiers are already being manufactured and sold.

In such a conventional BI-MOS integrated circuit device npn transistors are used as bipolar elements and p-channel MOS transistors are used as MOS elements. The method of producing such a BI-MOS integrated circuit device is described below with reference to FIG. 1.

At first as shown in FIG. 1(A), an n type high impurity density embedding layer 2 is produced on the p type silicon substrate 1, and thereafter, an n type low impurity density epitaxial layer 3 is grown thereon.

Thereafter, as shown in FIG. 1(B), a selective oxidization is conducted with an anti-oxidization film such as nitride film 4 as a mask, thereby producing thick oxide films 5 to electrically separate the element constituting regions 3a, 3b in the epitaxial layer 3.

Thereafter, as shown in FIG. 1(C), the silicon nitride films 4 are removed, silicon oxide films 6 are produced as protection films at the ion injection, and a photoresist film 7 is produced. Thereafter, boron ions are injected to the surface area of the semiconductor substrate through the oxide films 6 with the photoresist film 7 as a mask, and thereafter, the photoresist film 7 is removed, and the injected borons are driving-diffused by a thermal processing, thereby producing a base layer 8, a source layer 9, a drain layer 10 of all p types, and a diffusion resistance (not shown).

Thereafter, as shown in FIG. 1(D), an n type high impurity density (n+) collector contact layer 11 and an n+ emitter layer 12 are produced by an ion injection or a gas diffusion method.

And thereafter, as shown in FIG. 1(E), an oxide film 13, such as phosphite glass film, is deposited thereon, the portions of the oxide films 13 and 6 which portions are to become gates are both removed, and the gate oxide film 14 is produced again.

Finally, as shown in FIG. 1(F), contact holes are apertured to the oxide films 13 and 6 at the electrode leading regions, and the base electrode 15, emitter electrode 16, collector electrode 17, source electrode 18, gate electrode 19, and drain electrode 20, and other wirings are produced.

With respect to such BI-MOS integrated circuit devices, the requirements of high performance and high integration have become more severe. As shown in FIG. 2 which is a plan view of the device of FIG. 1(F), it is necessary to decrease the distance D between the one end of the contact hole 16a for the emitter electrode 16 which is a predetermined distance apart from the one end of the emitter (12)-base(8) junction and the one end of the contact hole 15a for the base electrode 15 in order to reduce the base resistance, and it is also necessary to decrease the area of the base layer 8 in order to reduce the base capacity. Furthermore, the integration density of MOS transistors in BI-MOS devices has become lower than that of the exclusive MOS element based on the overlapping of the gate oxide film 14 and the source/drain 9/10, and the increase of margin which is usually required caused by electrode wirings.

In manufacturing such an integrated circuit device it is an important problem to control the characteristic parameter of each element with high accuracy and high reproducibility. In BI-MOS integrated circuit devices the characteristic parameters which at least must be controlled are as follows:

(1) The junction resistivity of each element;
(2) The amplification factor of the npn transistor (hFE) the amplification factor of the pnp transistor (hFE); and
(3) The threshold voltage of the p-channel MOS transistor (Vth)
(4) The resistance value of the diffusion resistance (R).

As is apparent from the production process shown in FIG. 1, the heating process at an elevated temperature for producing gate oxide films must be executed after the n+ emitter diffusion process, and accordingly, the impurities in the n+ layer once diffused will be distributed again. Furthermore, it is quite difficult to control the amplification factor hFE of the npn transistor in the bipolar circuit portion with high accuracy, resulting in the biggest problem in the production process of BI-MOS integrated circuit device.

The following methods are considered for control the hFE of the npn transistor with high accuracy:

(a) controlling the hFE at the n+ emitter diffusion process considering the variation of the hFE by a heating process conducted thereafter.
(b) conducting only an n+ deposition at the n+ emitter diffusion process, and conducting a heating process in an inert ambient gas after all the heating processes required to produce MOS elements, including that for producing a gate oxide film, are conducted, thereby re-adjusting the value of hFE at the final process; and
(c) conducting the processes which should be conducted after the n+ emitter diffusion, including those for producing the gate oxide film of the MOS elements, at a low temperature, thereby suppressing the variation of hFE to the smallest value.

However, there are problems in all of these methods. For example, in the case of (a), the variations of the heating process to be conducted thereafter become large, making it difficult to predict the variation of the hFE with high reproducibility. In the case of (b), the variation of the Vth of the MOS element changes depending on the heating time in the heating process in an ambient inert gas. In the case of (c), it is difficult to control the energy level of the gate oxide film of the MOS element and that of the silicon substrate with high accuracy, thereby resulting in the instability of the Vth.

OBJECTS AND SUMMARY OF THE INVENTION

The present invention is directed to solve the problems pointed out above with respect to the conventional method, and has for its object to provide a method of producing a semiconductor integrated circuit device capable of obtaining a high frequency operation of the npn transistor and of enhancing the integration density of the MOS transistors without resulting in the uncontrollability of the hFE and the Vth, and or the instability of the Vth.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a method of producing a semiconductor integrated circuit device in which a bipolar element and a MOS element are produced on the same chip, which includes a first process for producing a silicon film on a portion of an electrode leading region of a first conductivity type base layer in the bipolar element and on the gate insulating film in the MOS element; and a second process for producing said base layer in the bipolar element and a source layer and a drain layer of a first conductivity type in the MOS element by using the silicon film.

BRIEF DESCRIPTION OF THE DRAWINGS

FIG. 1(A) to (F) are cross-sectional views showing the product each process of a prior art method of producing a BI-MOS integrated circuit device;

FIG. 4 is a plan view of the device of FIG. 3(C).

DETAILED DESCRIPTION OF THE PREFERRED EMBODIMENTS

Figure 3:
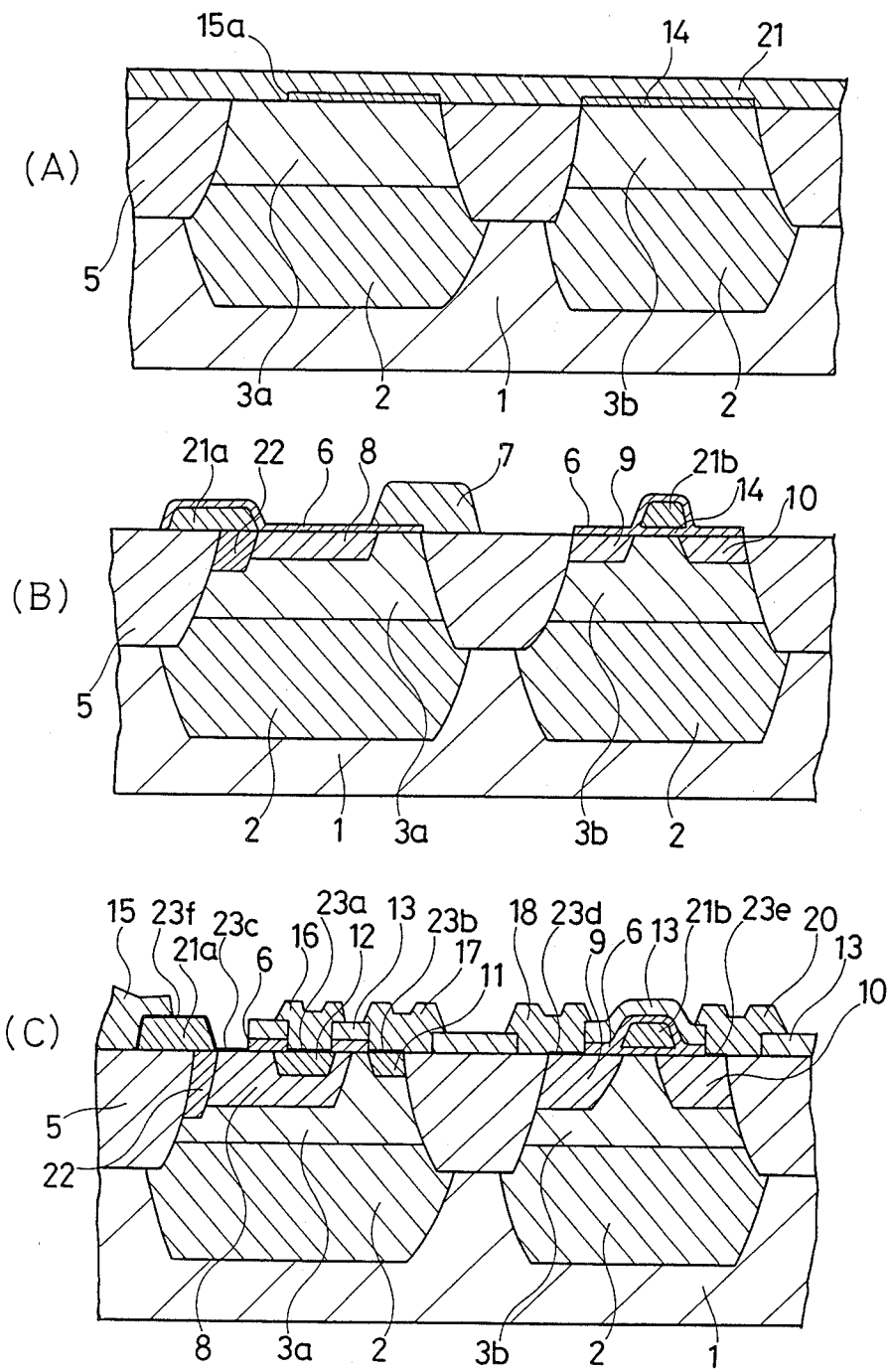
FIGS. 3(A) to (C) are cross-sectional views showing the product each process of a first embodiment of the presnt invention.

A method of producing a BI-MOS integrated circuit device as one embodiment of the present invention will be described in detail with reference to FIG. 3.

At first, the separate active regions 3a and 3b are produced similarly as in conventional method shown in FIGS. 1(A) to (B). Thereafter, as shown in FIG. 3(A), channel-doped ion injection is conducted on the channel portion of the MOS element so as to control the Vth, and thereafter, the gate oxide film 14 is produced. The portion 15a of the gate oxide film 14 for leading the base electrode is apertured by a usual photoresist-etching method, and thereafter, a silicon film 21 is deposited on the total surface thereof.

Thereafter, the oxide film below the silicon film 21 is used as the gate oxide film in the MOS element, and accordingly, it is better to produce a new clear gate oxide film after removing the oxide film used as the layer below the nitride film 4 when producing the thick oxide film 5 after the ion injection. The silicon film 21 may be a polysilicon film, or an epitaxial growth silicon film, or a porous silicon film.

Thereafter, as shown in FIG. 3(B), p type impurities are diffused into the polysilicon film 21, the base electrode leading layer 21a is produced with the p type impurities as diffusion sources, and the silicon film 21 is patterned by a known photoresist-etching technique so as to produce the gate electrode 21b. The layer below the base electrode leading layer, layer 22, is produced by the diffusion from the base electrode leading layer 21a, and the oxide film 6 is produced as an insulating film against the phosphite glass film 13 to be produced thereafter as well as for conducting an ion injection. Thereafter, the resist film 7 is produced covering the collector electrode leading region, and the p type impurities are introduced into the base layer 8 with the resist film 7 as a mask, and at the same time, the source 9 and the drain 10 are produced by self-alignment with the polysilicon film 21b which is to become gate electrode in the MOS transistor as a mask, and thereafter, the phosphite glass film 13 (passivation film) is deposited thereon.

Finally, as shown in FIG. 3(C), contact holes are apertured to the phosphite glass film 13 and the oxide film 6, an n type high impurity density diffusion is conducted to produce the emitter layer 12 and the collector electrode leading layer 11, and thereafter, contact holes are apertured in the phosphite glass film 13 and the oxide film 6 for the base, source, drain contacts and a contact for the polysilicon film, and aluminum electrodes 15, 16, 17, 18, 20 and other wirings are produced.

As evident from the foregoing description, in the method of producing a semiconductor integrated circuit device of the present invention, the polysilicon film including p type high density impurities is produced to be utilized for leading out the base electrode and for the gate electrode after the gate oxide film is produced. Accordingly, it is not necessary to conduct a heating process at an elevated temperature such as gate oxidization after producing the emitter diffusion layer which determines the hFE of the bipolar transistor. This provides a device capable of enhancing the controllability of the hFE without resulting in any instability of the Vth.

Figure 2:
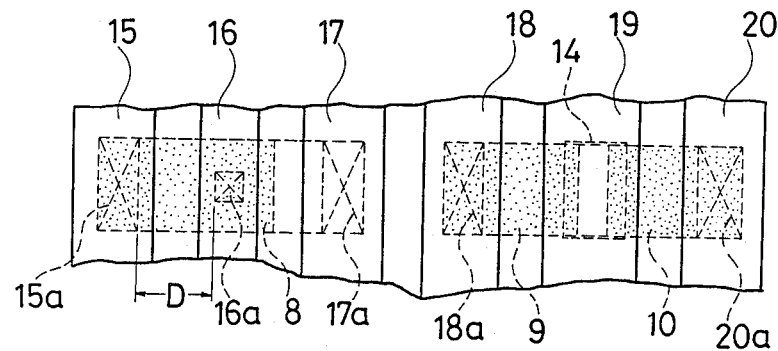
FIG. 2 is a plan view of the device shown in FIG. 1(F)

Furthermore, as is apparent from FIG. 4 which is a plan view of the FIG. 3(C), the distance D' between the one end of the contact hole 23a for the emitter electrode 16 and the one end of the contact hole 23c for the base electrode 15, which is an important parameter in view of the high frequency operation of the npn transistor, is improved to a value which is less than the half that of the distance D in device of FIG. 2. This is because that the distance between the aluminum electrodes 15 and 16 which is required to be sufficiently large in the prior art device has become short in the present invention because the base electrode leading region, and the base leading layers are produced through the polysilicon film 21a. Thus, the base area has been reduced to about four fifths, and high frequency operation of the npn transistor is obtained. Furthermore, in MOS transistors of the present invention a polysilicon gate is employed, thereby enabling production of the source and drain by self-alignment without the necessity of providing long distances between these elements and the gate electrode 19 which were required in the prior art device. The integration density of the present invention has increased to about two times that of the prior art device.

The characteristics of the MOS transistors of the present invention are enhanced to the same levels as those manufactured as exclusive MOS transistors.

In the above-illustrated embodiment, the separation between elements attained by the oxide films, but the present invention can be applied to those in which the separation between elements is conducted by $p^+$-n junctions.

Furthermore, when polysilicon films are used as the electrode wirings, the resistances will become high compared with metal wirings such as aluminum. So, if there arises a problem in circuit design, it is possible to decrease the resistance by producing layers 23a to 23f of high conductivity anti-heat material such as molybdenum-silicide or platinum-silicide on the polysilicon film before depositing the phosphite glass film.

As described above, according to the present invention, a polysilicon film is produced prior to the process for producing the base layer of the bipolar element and the source and drain layers of the MOS element, the leading of the base electrode is conducted from one portion of the polysilicon film, the gate wiring is conducted by using the remaining portions of the polysilicon film, and the source and the drain of the MOS transistor are produced with this polysilicon film, which has become the gate, as a mask. As a result, the ability to control the hFE is enhanced by conducting the process for producing the gate oxide film prior to the process for producing the emitter layer. The high frequency operation of the npn transistor is realized by using a silicon film for leading the base electrode thereby to shorten the above-described distance D and also to minimize the base area. The enhancement of the integration density of the MOS transistor is realized by using a polysilicon gate.

What is claimed is:

1. A method of producing a BI-MOS semiconductor integrated device, comprising the steps of:
    forming a plurality of epitaxial regions of a first conductivity type separated by oxide regions on a substrate of a second conductivity type;
    forming a first oxide film on said epitaxial regions so as to provide for an aperture over a first portion of a first epitaxial region and so as to cover a second epitaxial region;
    depositing a silicon film on said first oxide film, on said oxide regions and through said aperture on said first portion of said first epitaxial region;
    forming a base leading electrode region above said first epitaxial region and a gate electrode region above said second epitaxial region by diffusing second conductivity type impurities into said silicon film;
    patterning said silicon film by removing portions thereof;
    forming a base lower leading region below said base leading electrode region by diffusion of impurities from said base leading electrode region into said base lower leading region;
    forming an oxide insulation film on said base leading electrode region, on said gate electrode region, and on said first and second epitaxial regions;
    forming a resist film over a second portion of said first epitaxial region;
    forming a bipolar element base layer in said first epitaxial region, and a MOS element source layer and a MOS element drain layer in said second epitaxial region by diffusion of second conductivity type impurities into said epitaxial regions, wherein said resist film masks said first epitaxial region so that a collector leading region may be formed and wherein said gate electrode region acts as a mask so that said source layer and said drain layer are self-aligned;
    forming a passivation film at least over said oxide insulation layer so as to provide for emitter and collector apertures;
    forming an emitter leading layer and a collector leading layer by diffusion of first conductivity type impurities into said first epitaxial region;
    forming contact apertures in said passivation film and in said oxide insulation layer; and
    forming a base electrode, an emitter electrode, a collector electrode, a source electrode, and a drain electrode in said contact apertures.

2. The method of producing a BI-MOS semiconductor integrated circuit device as defined in claim 1, which further comprises forming conductivity layers between said base leading electrode region, said base layer, said emitter leading layer, said collector leading layer, said source layer, said drain layer and the respective electrodes formed thereon, wherein said conductivity layers comprise high conductivity heat-resistant material and decrease electrical resistance.

3. The method of producing a BI-MOS semiconductor integrated circuit device as defined in claim 2, wherein said silicon film comprises polysilicon, epitaxial grown silicon, or porous silicon, and wherein said conductivity layers comprise molybdenum silicide or platinum silicide.

4. The method of producing a BI-MOS semiconductor integrated circuit device as defined in claim 2, wherein said passivation film comprises phosphite glass and said electrodes comprise aluminum, and wherein the device produced operates at high frequency and has a high integration density.

5. The method of producing a BI-MOS semiconductor integrated circuit device as defined in claim 3, wherein said passivation film comprises phosphite glass and said electrodes comprise aluminum, and wherein the device produced operates at high frequency and has a high integration density.

* * * * *